(12) United States Patent
Richter et al.

(10) Patent No.: US 8,435,841 B2
(45) Date of Patent: May 7, 2013

(54) ENHANCEMENT OF ULTRAVIOLET CURING OF TENSILE STRESS LINER USING REFLECTIVE MATERIALS

(75) Inventors: Ralf Richter, Dresden (DE); Torsten Huisinga, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 258 days.

(21) Appl. No.: 12/975,515

(22) Filed: Dec. 22, 2010

(65) Prior Publication Data

US 2012/0161242 A1 Jun. 28, 2012

(51) Int. Cl.
*H01L 21/00* (2006.01)
*H01L 29/745* (2006.01)

(52) U.S. Cl.
USPC ........... 438/154; 438/199; 438/308; 438/795; 257/213; 257/274; 257/E27.062; 257/E21.158

(58) Field of Classification Search ................... 438/142, 438/153, 154, 199, 308, 761, 795; 257/213, 257/274, 369, E27.062, E21.158; 327/437; 326/119

See application file for complete search history.

(56) References Cited

U.S. PATENT DOCUMENTS

| | | | |
|---|---|---|---|
| 7,763,509 B2 * | 7/2010 | Pidin et al. | 438/199 |
| 7,777,284 B2 * | 8/2010 | Chen et al. | 257/415 |
| 2008/0124856 A1 * | 5/2008 | Pidin et al. | 438/199 |

\* cited by examiner

*Primary Examiner* — Hsien Ming Lee
(74) *Attorney, Agent, or Firm* — Ingrassia Fisher & Lorenz, P.C.

(57) ABSTRACT

A method of manufacturing a semiconductor device begins by fabricating an n-type metal oxide semiconductor (NMOS) transistor structure on a semiconductor wafer. The method continues by forming an optically reflective layer overlying the NMOS transistor structure, forming a layer of tensile stress inducing material overlying the optically reflective layer, and curing the layer of tensile stress inducing material by applying ultraviolet radiation. Some of the ultraviolet radiation directly radiates the layer of tensile stress inducing material and some of the ultraviolet radiation radiates the layer of tensile stress inducing material by reflecting from the optically reflective layer.

12 Claims, 8 Drawing Sheets

ENHANCEMENT OF ULTRAVIOLET CURING OF TENSILE STRESS LINER USING REFLECTIVE MATERIALS

TECHNICAL FIELD

Embodiments of the subject matter described herein relate generally to semiconductor devices and related fabrication techniques. More particularly, embodiments of the subject matter relate to the use of ultraviolet-cured tensile stress liners for semiconductor transistor devices.

BACKGROUND

The majority of present day integrated circuits (ICs) are implemented by using a plurality of interconnected field effect transistors (FETs), which may be realized as metal oxide semiconductor field effect transistors (MOSFETs or MOS transistors). A MOS transistor may be realized as a p-type device (i.e., a PMOS transistor) or an n-type device (i.e., an NMOS transistor). Moreover, a semiconductor device can include both PMOS and NMOS transistors, and such a device is commonly referred to as a complementary MOS or CMOS device. A MOS transistor includes a gate electrode as a control electrode that is formed over a semiconductor substrate, and spaced-apart source and drain regions formed within the semiconductor substrate and between which a current can flow. The source and drain regions are typically accessed via respective conductive contacts formed on the source and drain regions. Bias voltages applied to the gate electrode, the source contact, and the drain contact control the flow of current through a channel in the semiconductor substrate between the source and drain regions beneath the gate electrode. Conductive metal interconnects (plugs) formed in an insulating layer are typically used to deliver bias voltages to the gate, source, and drain contacts.

Stress liners are often used to enhance the performance of MOS transistor devices. For example, tensile stress liner material may be formed overlying NMOS transistor devices and compressive stress liner material may be formed overlying PMOS transistor devices. Tensile plasma enhanced nitride (TPEN) is commonly used as a tensile stress liner material. Some fabrication processes cure the TPEN liner with ultraviolet (UV) radiation to enhance the tensile properties of the TPEN liner material. The penetration depth of the UV radiation may not be sufficient to uniformly cure the TPEN liner, due to the topology of the transistor devices.

Existing techniques and processes that address the non-uniformity of UV-cured TPEN liners are inefficient, complex, time consuming, and/or costly. Accordingly, it is desirable to have an effective and cost-effective solution to the problem of non-uniform UV-cured TPEN liner material.

BRIEF SUMMARY

An exemplary embodiment of a method of manufacturing a semiconductor device is provided. The method fabricates an NMOS transistor structure on a semiconductor wafer. The method continues by forming an optically reflective layer overlying the NMOS transistor structure, forming a layer of tensile stress inducing material overlying the optically reflective layer, and curing the layer of tensile stress inducing material by applying ultraviolet radiation such that some of the ultraviolet radiation directly radiates the layer of tensile stress inducing material and such that some of the ultraviolet radiation radiates the layer of tensile stress inducing material by reflecting from the optically reflective layer.

Also provided is an exemplary embodiment of a semiconductor device. The semiconductor device includes at least one NMOS transistor structure on a semiconductor wafer, at least one PMOS transistor structure on the semiconductor wafer, and a layer of optically reflective material overlying the at least one NMOS transistor structure and the at least one PMOS transistor structure. The semiconductor device also includes a layer of tensile stress inducing material overlying the layer of optically reflective material. The layer of tensile stress inducing material is cured with ultraviolet radiation reflected from the layer of optically reflected material.

Also provided is another exemplary embodiment of a method of manufacturing a semiconductor device. The method involves: fabricating an NMOS transistor structure on a semiconductor wafer, the NMOS transistor structure comprising exposed terminal contact regions; modifying optical reflective properties of the exposed terminal contact regions to create optically reflective regions of the NMOS transistor structure; forming a layer of tensile stress inducing material overlying the optically reflective regions; and curing the layer of tensile stress inducing material by applying ultraviolet radiation such that some of the ultraviolet radiation directly radiates the layer of tensile stress inducing material and such that some of the ultraviolet radiation radiates the layer of tensile stress inducing material by reflecting from the optically reflective regions.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate a semiconductor device having one or more transistor devices, typically, MOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
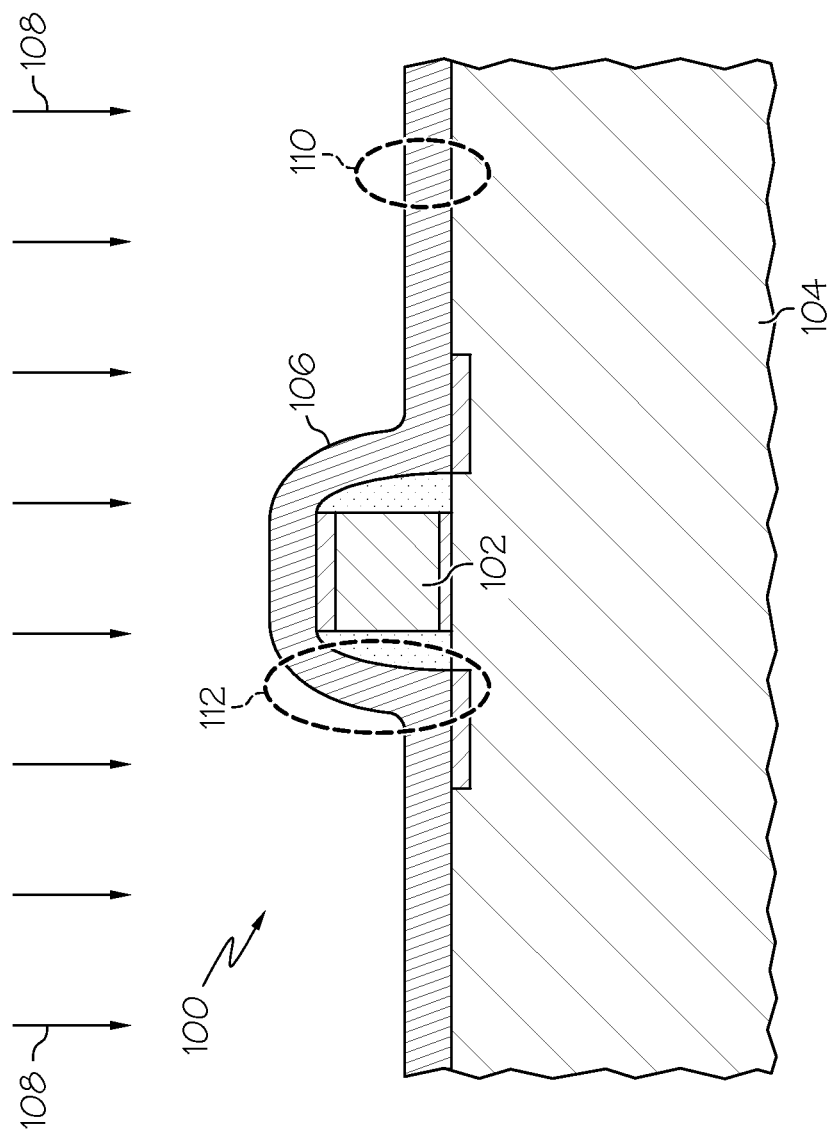
FIG. 1 is a cross sectional view of a semiconductor transistor device structure undergoing a conventional UV curing step.

The techniques and technology described here relate to the use of UV radiation to cure a tensile stress liner material for semiconductor transistor devices. Tensile stress liners may be used in connection with certain CMOS processes. For example, an existing CMOS process employs UV-cured TPEN as a stress liner for NMOS transistor devices. In this regard, FIG. 1 is a cross sectional view of a semiconductor transistor device structure 100 undergoing a conventional UV curing step. The transistor device structure 100 includes a gate stack 102 formed overlying semiconductor material 104 of a wafer or substrate. FIG. 1 depicts a layer of TPEN 106, which is conformally deposited overlying the gate stack 102.

Figure 2:
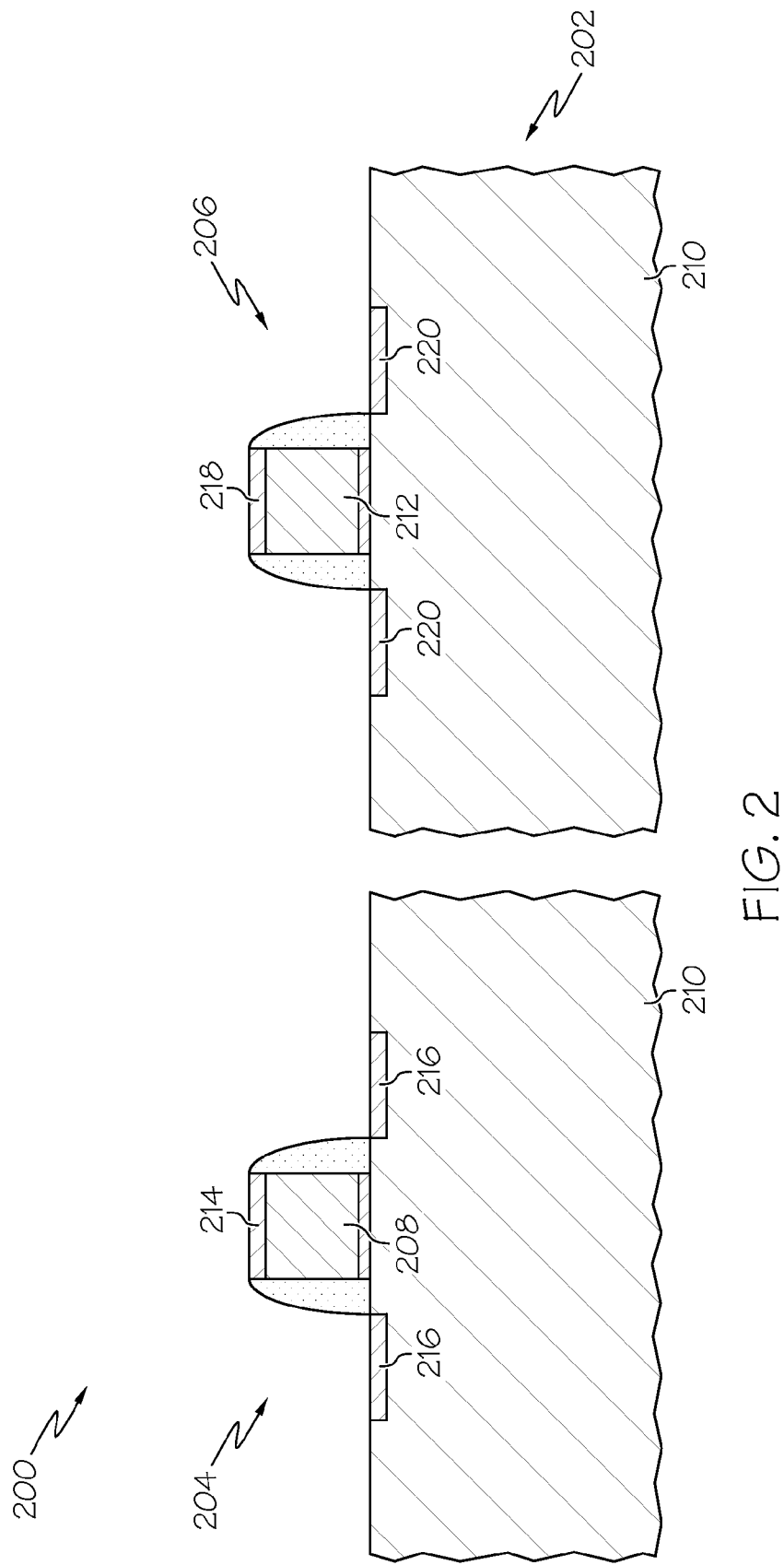
FIGS. 2-6 are cross sectional views that illustrate a semiconductor device and an exemplary embodiment of a related fabrication process.

Before UV curing, the stress of the TPEN 106 may be about 1.0 GPa (for example). FIG. 2 depicts the UV radiation 108 that is used to cure the TPEN 106. After UV curing, the stress of the TPEN 106 increases. For example, the stress of the UV-cured TPEN 106 may be about 1.7 GPa. In practice, the penetration depth of the UV radiation 108 is limited. Typically, the penetration depth of the UV radiation 108 is less than about 100 nm, and usually less than about 50 nm. Consequently, if the TPEN 106 is too thick, the UV radiation 108 may not uniformly cure the lower regions of the layer of TPEN 106. Referring to FIG. 1, the relatively thin area 110 of the TPEN 106 may be adequately cured, but the relatively thick area 112 may not be adequately cured (especially the lower region). In other words, the UV curing and the resulting increase in tensile stress may be non-uniform and inconsistent due to the topography of the transistor device structure 100.

An existing fabrication approach addresses the aforementioned problem of non-uniformly cured TPEN. This solution achieves better UV-cure uniformity by performing multiple TPEN deposition and UV curing steps. This approach deposits an initial and relatively thin layer of TPEN overlying the transistor structure, and cures the initial layer with UV radiation. Thereafter, a second relatively thin layer of TPEN is deposited overlying the cured initial TPEN layer. Next, the second layer of TPEN is subjected to a second UV curing step. If needed, the deposition and curing steps can be repeated three or more times. Although this approach results in better UV curing uniformity, the multiple steps require additional processing time and, therefore, additional fabrication cost.

The fabrication process presented here can be used to create a semiconductor device that employs single stress liner technology with a UV-cured tensile stress inducing layer. Single stress liner technology refers to a fabrication process that uses a common stress liner (e.g., a tensile stress liner) for both NMOS and PMOS transistor devices on a semiconductor wafer. In practice, if a single tensile stress liner is used for both NMOS and PMOS transistor devices, the portion of the stress liner overlying the PMOS transistor devices can be treated or otherwise handled to reduce any adverse effects that might be introduced by the tensile material.

FIGS. 2-6 are cross sectional views that illustrate the fabrication of a semiconductor device in accordance with an exemplary embodiment. FIG. 2 depicts a semiconductor device structure 200 on a semiconductor wafer 202 (or other substrate) after several preliminary and conventional front end process steps have been completed. The device structure 200 may be formed using a silicon-on-insulator (SOI) substrate or wafer, which includes a support layer, an insulating layer overlying the support layer, and a layer of semiconductor material overlying the insulating layer. In alternate embodiments, the device structure 200 may be formed on a bulk semiconductor substrate rather than an SOI substrate. Although any suitable semiconductor material may be employed, for this embodiment the semiconductor material is a silicon material, where the term "silicon material" is used herein to encompass the generally monocrystalline and relatively pure silicon materials typically used in the semiconductor industry, as well as silicon admixed with other elements such as germanium, carbon, and the like. Alternatively, the semiconductor material can be germanium, gallium arsenide, or the like. The semiconductor material can originally be either n-type or p-type silicon, but is typically p-type, and the semiconductor material is subsequently doped in an appropriate manner to form active regions. The active regions can be used for the source and drain regions of the resulting transistor devices.

At the state shown in FIG. 2, the device structure 200 includes at least one NMOS transistor structure 204 on the semiconductor wafer 202, and at least one PMOS transistor structure 206 on the semiconductor wafer 202. In other embodiments, the device structure 200 may include only NMOS transistor structures and no PMOS transistor structures. The NMOS transistor structure 204 includes a gate structure 208 formed overlying a layer of semiconductor material 210. Similarly, the PMOS transistor structure 206 includes a gate structure 212 formed overlying the layer of semiconductor material 210. The NMOS transistor structure 204 includes three exposed terminal contact regions: a gate contact region 214 and two source/drain contact regions 216. Likewise, the PMOS transistor structure 206 includes three exposed terminal contact regions: a gate contact region 218 and two source/drain contact regions 220. As is well understood, the various contact regions may be formed as silicide material.

Figure 3:
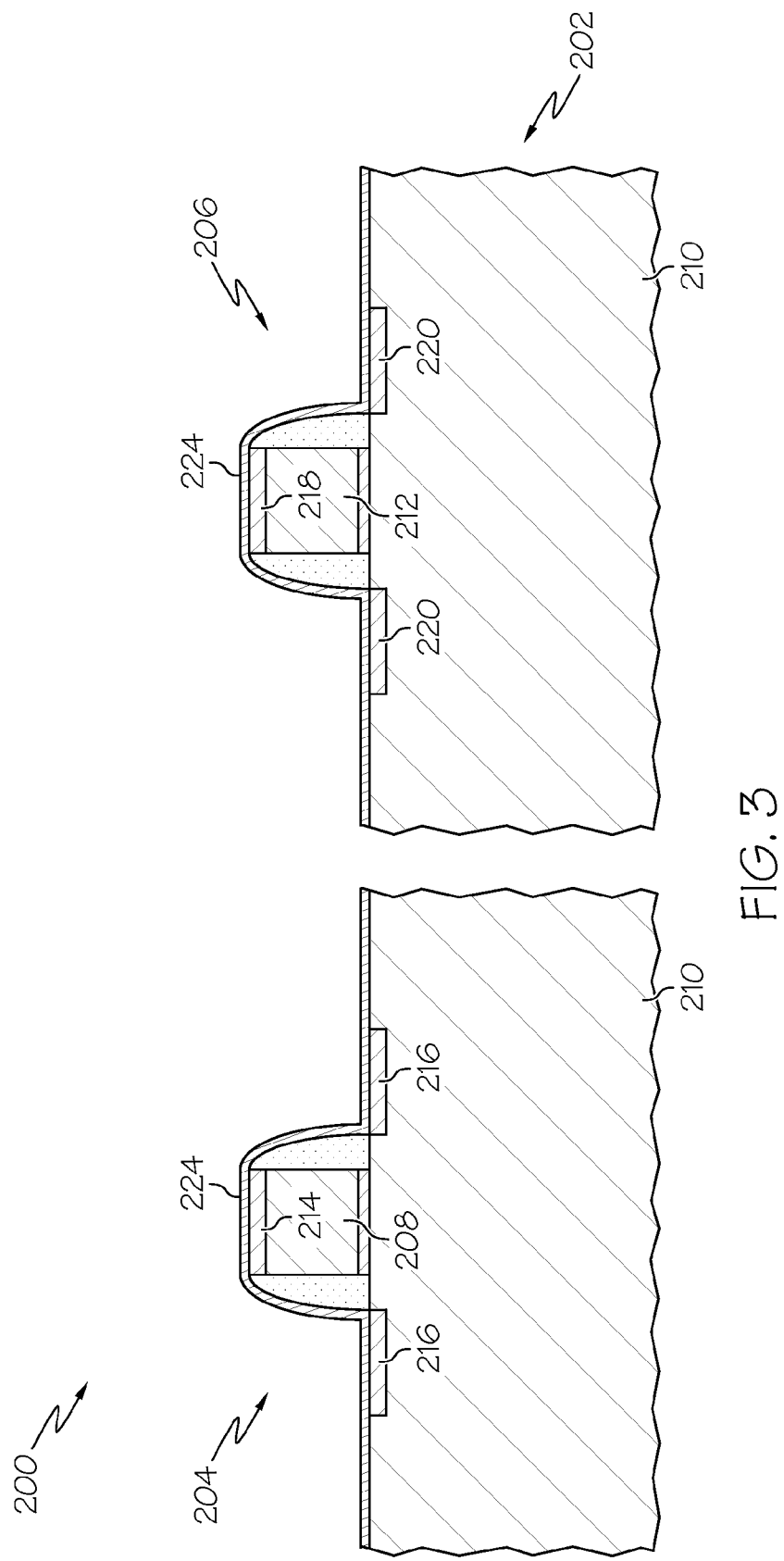

After fabrication of the transistor structures 204, 206 is complete, the process continues by forming a layer of optically reflective material 224 overlying the NMOS transistor structure 204 and the PMOS transistor structure 206. FIG. 3 depicts the semiconductor device structure 200 after formation of the layer of optically reflective material 224. The optically reflective material 224 is a material or composition that has a lower refractive index than the tensile stress inducing material (that is formed in a subsequent process step), which results in the desired reflective properties. In this regard, the optically reflective material 224 has optical properties and characteristics that make it reflective to the UV radiation used to cure the tensile stress inducing material. Depending upon the particular embodiment, the composition of the optically reflective material 224 may be, without limitation: a silicon oxide material such as silicon dioxide ($SiO_2$); silane oxide; tetraethyl orthosilicate (TEOS); fluorinated TEOS; or the like. Although not always required, the exemplary embodiment described here uses SiO$_2$ as the optically reflective material 224.

In practice, the optically reflective material 224 can be conformally deposited overlying the transistor structures 204, 206 and overlying the upper exposed surface of the semiconductor material 210, as shown in FIG. 2. In certain embodiments, the optically reflective material 224 is a silicon oxide material that is deposited using any conventional technique such as, and without limitation: chemical vapor deposition (CVD), low pressure chemical vapor deposition (LPCVD), or plasma enhanced chemical vapor deposition (PECVD). Notably, a very thin layer of the optically reflective material 224 is deposited to ensure that the optically reflective material 224 does not reduce the amount of stress imparted by the tensile stress inducing material (which is formed in a subsequent process step). Ideally, the optically reflective material 224 is deposited as thin as possible while maintaining its reflective properties. In certain embodiments, for example, the optically reflective material 224 is deposited to a thickness that is less than 10 nm, preferably less than 5 nm. In other embodiments, greater thickness could be tolerated without adversely affecting the amount of tensile stress imparted by the overlying stress inducing material.

Figure 4:
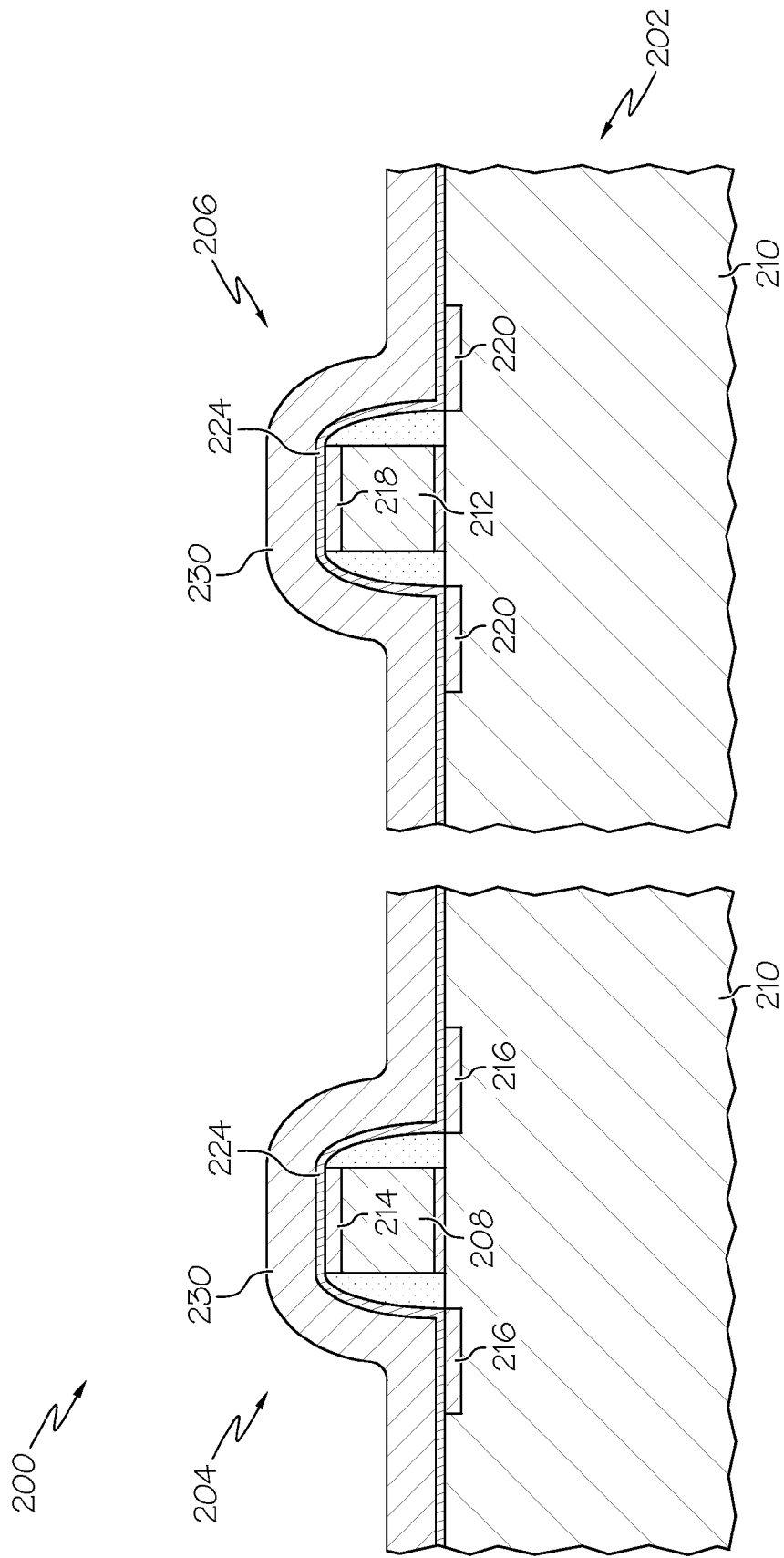

The fabrication process continues by forming a layer of tensile stress inducing material 230 overlying the optically reflective material 224 (see FIG. 4). The tensile stress inducing material 230 may include or be realized as, for example, a TPEN material, as is commonly used throughout the semiconductor industry. When TPEN is used as the tensile stress inducing material 230, it is conformally deposited overlying the optically reflective material 224 using PECVD. In typical implementations, the layer of tensile stress inducing material 230 is deposited to a thickness within the range of about 10 nm to about 100 nm, although the actual thickness may be outside of this range for certain embodiments.

Figure 5:
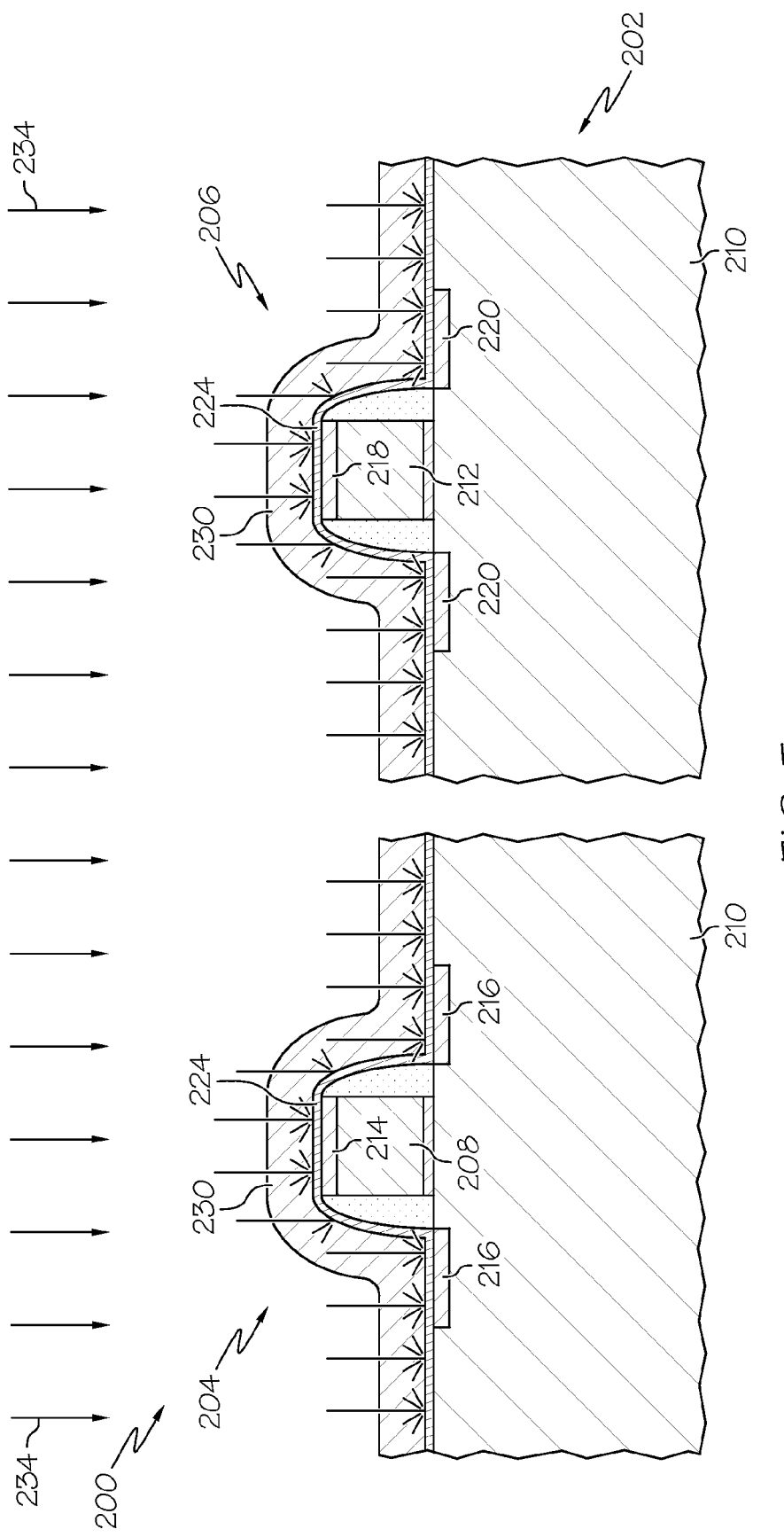
Figure 6:
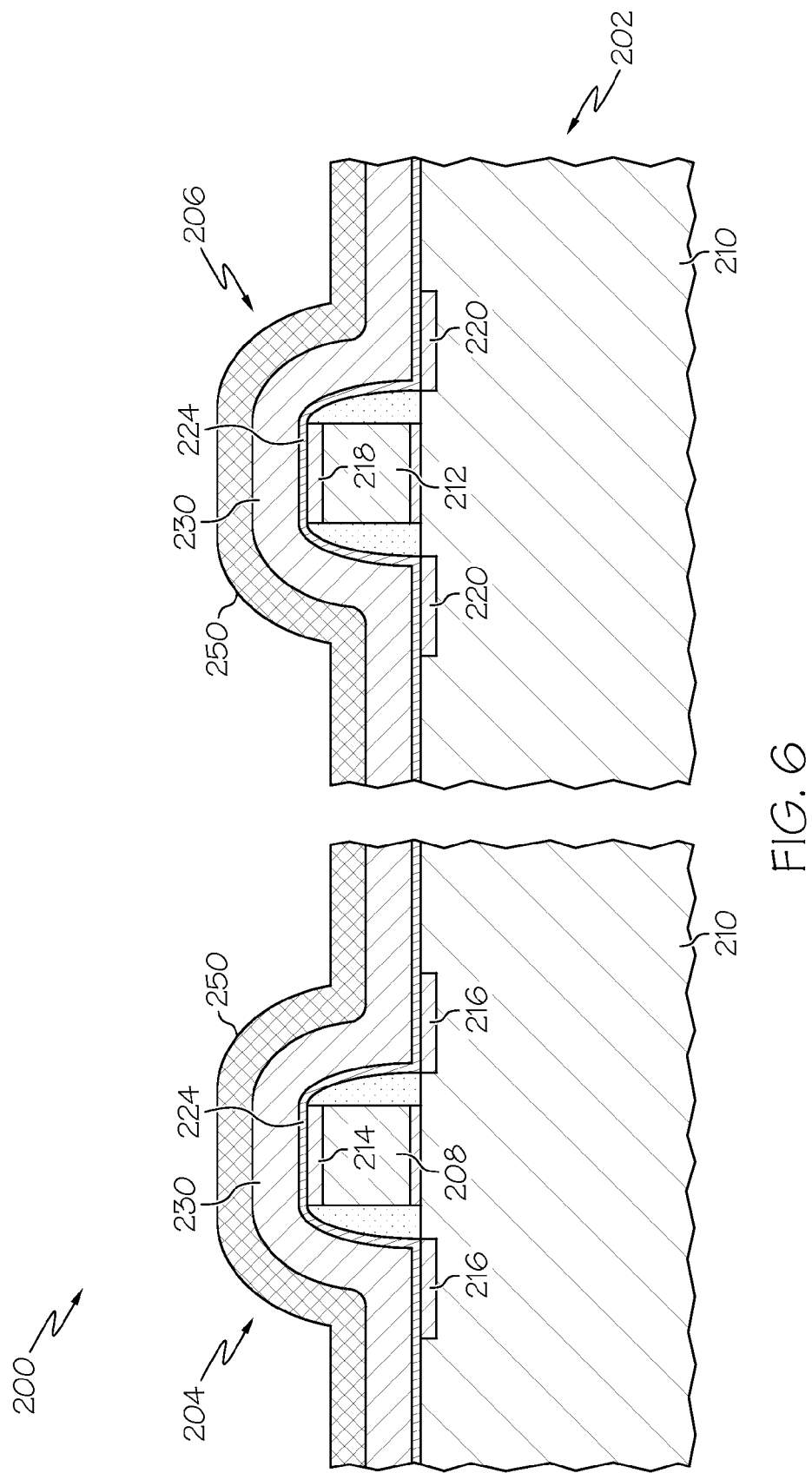

The exemplary fabrication process continues by curing the layer of tensile stress inducing material 230 by applying UV radiation at a high temperature, e.g., 500 degrees Celsius. FIG. 5 shows how the UV radiation 234 penetrates the tensile stress inducing material 230 during the UV-curing step. Some of the UV radiation 234 directly radiates and cures the tensile stress inducing material 230, and some of the UV radiation 234 radiates the tensile stress inducing material 230 by reflecting from the layer of optically reflective material 224. The optical properties of the reflective material 224 cause the UV radiation 234 to reflect and scatter back into the tensile stress inducing material 230, which makes the UV curing more effective and uniform throughout the thickness of the tensile stress inducing material 230. Moreover, backscattering at different angles of reflection is modulated by surface "roughness" and imperfections in the optically reflective material 224. In this regard, the UV radiation 234 is reflected at angles other than the theoretical angle of incidence, resulting in distributed UV radiation reflected back into the tensile stress inducing material 230. Thus, different angles of reflection can be achieved from the planar surfaces (the horizontal surfaces in FIG. 5) as well as from the sidewall surfaces of the gate structures 208, 212.

After the tensile stress inducing material 230 has been cured in this manner, any number of known process steps can be performed to complete the fabrication of the semiconductor device structure 200. For example, conventional backend processes can be performed to create conductive contact plugs, interconnect layers, and the like. In certain embodiments, however, the fabrication process continues by forming another layer of tensile stress inducing material 250 overlying the cured layer of tensile stress inducing material 230 (see FIG. 6). The second layer of tensile stress inducing material 250 may also be subjected to UV curing by exposing it to UV radiation, as described previously. The second layer of tensile stress inducing material 250 may be cured in this manner with or without any enhancement caused by reflected UV radiation. In practice, the combined thickness of the two layers of tensile stress inducing material 230, 250 may limit the amount of reflected UV radiation during this curing step. If desired, additional layers of stress inducing material, cured or uncured, may be applied using a similar approach. Thereafter, the fabrication of the semiconductor device structure 200 is completed using conventional process steps.

Figure 7:
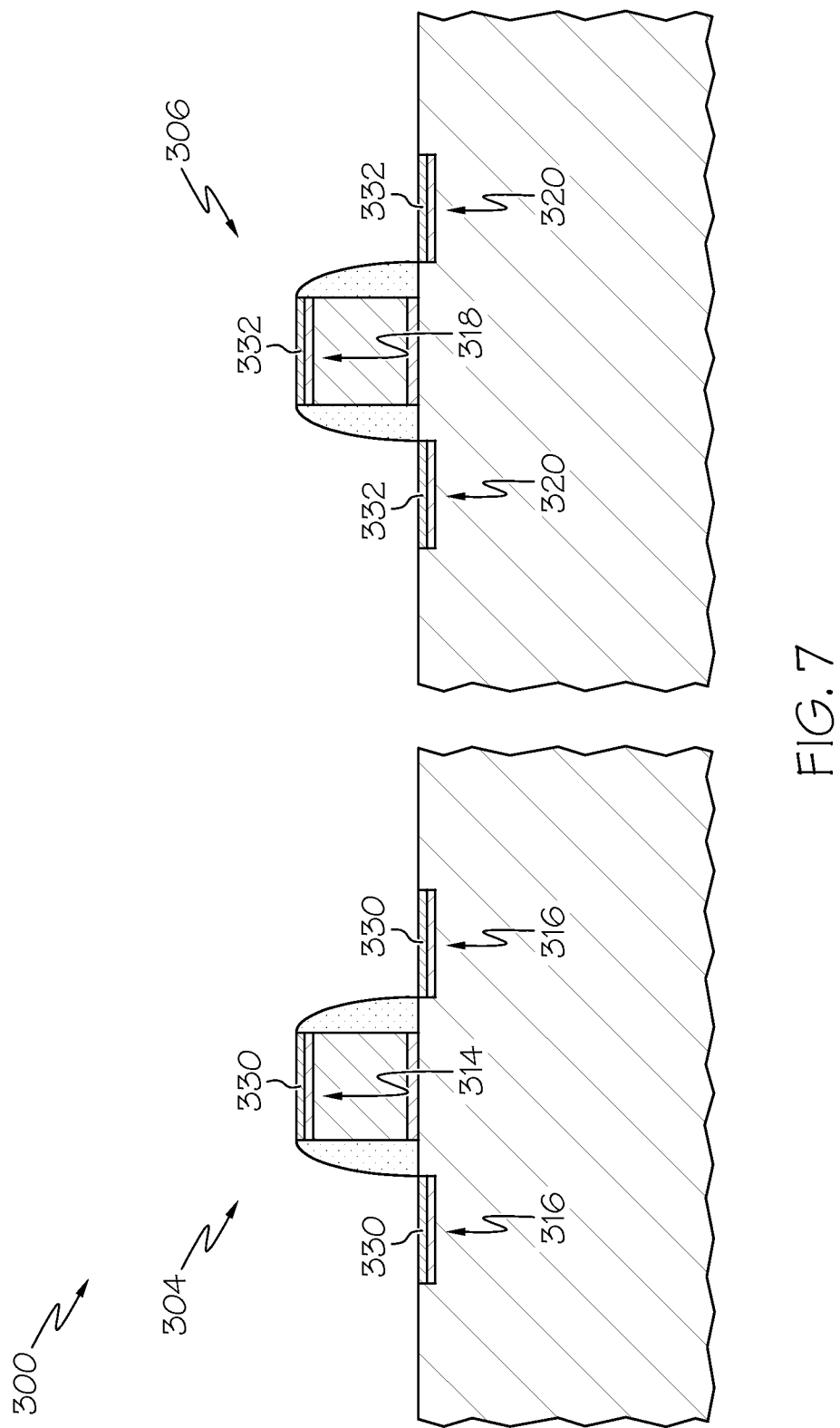
FIGS. 7 and 8 are cross sectional views that illustrate another semiconductor device and an exemplary embodiment of a related fabrication process.

The exemplary process described above forms a layer of reflective material that functions as the reflector of UV radiation during the UV curing step. An alternate embodiment need not form an additional layer of material per se. Rather, one or more underlying features of the semiconductor device structure are treated, modified, or otherwise transformed to alter their reflective properties. In this regard, FIG. 7 depicts the state of a semiconductor device structure 300 at an intermediate stage of the fabrication process (which follows the stage depicted in FIG. 2). The state of the device structure 300 shown in FIG. 7 is achieved by modifying the optical reflective properties of the exposed terminal contact regions 314, 316, 318, 320 of the NMOS and PMOS transistor structures 304, 306. These contact regions are modified in a way that creates optically reflective regions 330 of the NMOS transistor structure 304 and optically reflective regions 332 of the PMOS transistor structure 306. In this regard, the contact regions may be treated or otherwise processed to alter their surface properties and characteristics such that their refractive indices are lower than the refractive index of the tensile stress inducing material that will be used as the tensile stress layer.

Figure 8:
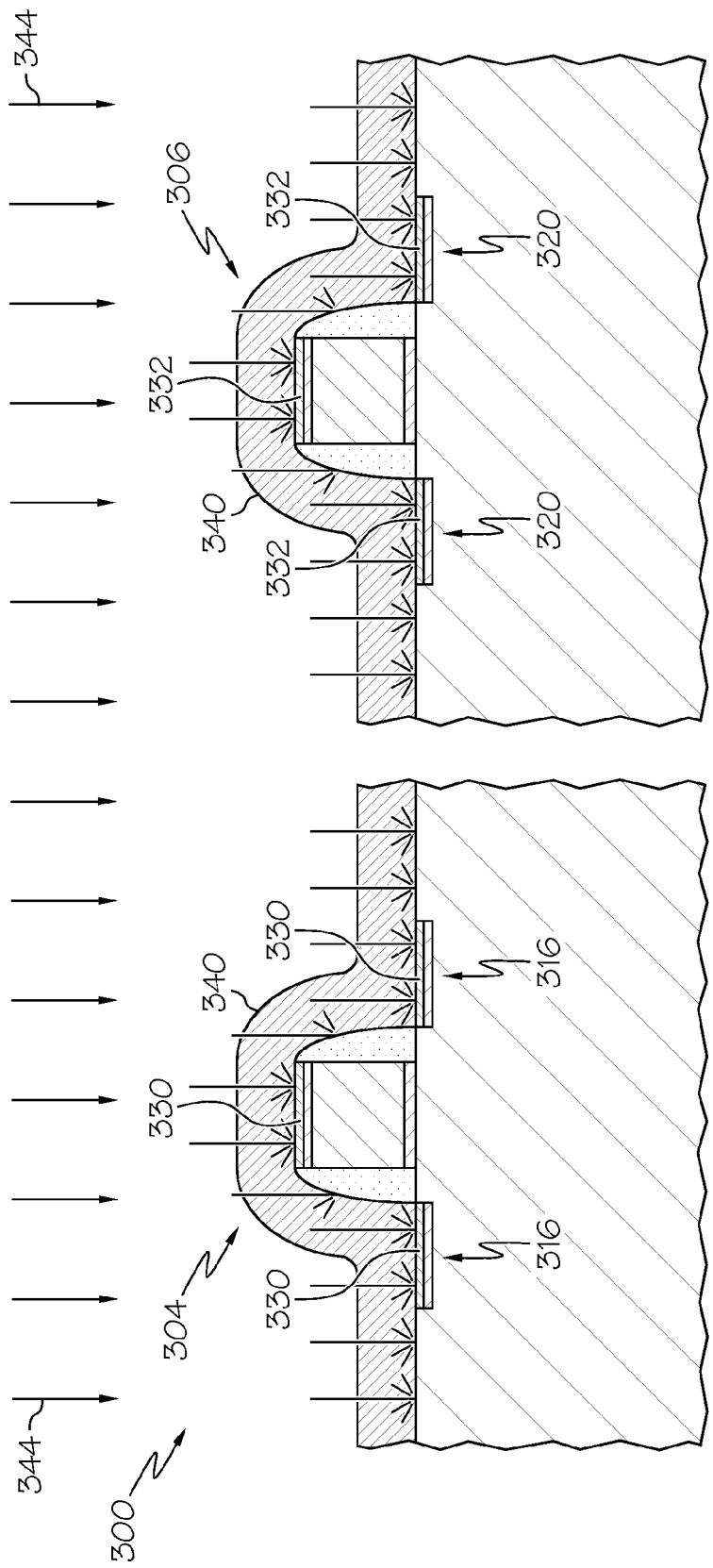

In certain embodiments, the optical reflective properties of the contact regions 314, 316, 318, 320 are modified by oxidizing the exposed material in a way that forms a reflective surface. For example, the optically reflective regions 330, 332 may be created by introducing an oxygen-containing plasma to the exposed terminal contact regions 314, 316, 318, 320, resulting in the desired amount of oxidation. Thereafter, fabrication of the semiconductor device structure 300 may continue in the manner described above for the previous embodiment. Thus, a layer of tensile stress inducing material 340 is formed overlying the NMOS and PMOS transistor structures 304, 306 (and, in particular, overlying the optically reflective regions 330, 332), and the layer of tensile stress inducing material 340 is cured by applying UV radiation 344, as depicted in FIG. 8. Some of the UV radiation 344 directly radiates and cures the layer of tensile stress inducing material 340, and some of the UV radiation 344 radiates the layer of tensile stress inducing material 340 by reflecting from the optically reflective regions 330, 332. The reflection of the UV radiation 344 enhances the UV curing step and increases the uniformity in the cured stress inducing material 340.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of manufacturing a semiconductor device, the method comprising:
    fabricating an n-type metal oxide semiconductor (NMOS) transistor structure on a semiconductor wafer;
    forming an optically reflective layer overlying the NMOS transistor structure;
    forming a layer of tensile stress inducing material overlying the optically reflective layer; and
    curing the layer of tensile stress inducing material by applying ultraviolet radiation such that some of the ultraviolet radiation directly radiates the layer of tensile stress inducing material and such that some of the ultraviolet radiation radiates the layer of tensile stress inducing material by reflecting from the optically reflective layer.

2. The method of claim 1, the forming of the optically reflective layer comprising depositing a material having a lower refractive index than the layer of tensile stress inducting material.

3. The method of claim 1, the forming of the optically reflective layer comprising depositing a silicon oxide material.

4. The method of claim 3, the depositing of the silicon oxide material comprising depositing the silicon oxide material to a thickness less than ten nanometers.

5. The method of claim 1, the forming of the layer of tensile stress inducing material comprising depositing a tensile plasma enhanced nitride (TPEN) material.

6. The method of claim 1, further comprising fabricating a p-type metal oxide semiconductor (PMOS) transistor structure on the semiconductor wafer, the optically reflective layer being formed overlying the NMOS transistor structure and the PMOS transistor structure.

7. The method of claim 1, further comprising:
    after curing the layer of tensile stress inducing material to obtain a cured layer of tensile stress inducing material, forming a second layer of tensile stress inducing material overlying the cured layer of tensile stress inducing material; and
    curing the second layer of tensile stress inducing material by applying ultraviolet radiation to the second layer of tensile stress inducing material.

8. A semiconductor device comprising:
    at least one n-type metal oxide semiconductor (NMOS) transistor structure on a semiconductor wafer;
    at least one p-type metal oxide semiconductor (PMOS) transistor structure on the semiconductor wafer;
    a layer of optically reflective material overlying the at least one NMOS transistor structure and the at least one PMOS transistor structure; and
    a layer of tensile stress inducing material overlying the layer of optically reflective material, the layer of tensile stress inducing material cured with ultraviolet radiation reflected from the layer of optically reflected material.

9. The semiconductor device of claim 8, the optically reflective material having a lower refractive index than the tensile stress inducing material.

10. The semiconductor device of claim 9, the optically reflective material comprising a silicon oxide material.

11. The semiconductor device of claim 10, the silicon oxide material having a thickness less than ten nanometers.

12. The semiconductor device of claim 8, the tensile stress inducing material comprising a tensile plasma enhanced nitride (TPEN) material.

* * * * *